United States Patent [19]

Cho

[11] Patent Number: 5,573,978
[45] Date of Patent: Nov. 12, 1996

[54] METHOD OF FORMING A METAL WIRE IN A SEMICONDUCTOR DEVICE

[75] Inventor: Gyeong S. Cho, Seoul, Rep. of Korea

[73] Assignee: Hyundai Electronics Industries Co., Ltd., Kyungki-Do, Rep. of Korea

[21] Appl. No.: 305,307

[22] Filed: Sep. 15, 1994

[30] Foreign Application Priority Data

Sep. 15, 1993 [KR] Rep. of Korea ............... 93-18527

[51] Int. Cl.⁶ ............................................. H01L 21/44
[52] U.S. Cl. ..................... 437/192; 437/190; 437/194; 437/246; 437/247
[58] Field of Search ........................... 437/192, 190, 437/194, 246, 247

[56] References Cited

U.S. PATENT DOCUMENTS

| | | | |
|---|---|---|---|
| 4,783,248 | 11/1988 | Kohlhase et al. | |
| 4,983,250 | 1/1991 | Pan | 156/628 |
| 5,162,262 | 11/1992 | Ajika et al. | 437/200 |
| 5,231,052 | 7/1993 | Lu et al. | 437/190 |
| 5,378,660 | 1/1995 | Ngan et al. | 437/247 |

FOREIGN PATENT DOCUMENTS

| | | |
|---|---|---|
| 2-105411 | 4/1990 | Japan. |
| 5-3254 | 1/1993 | Japan. |
| 0529316 | 2/1993 | Japan. |
| 5-251567 | 8/1993 | Japan. |
| 6120357 | 4/1994 | Japan. |

OTHER PUBLICATIONS

J. J. Estabil, et al "Electromigration Improvements with Titaneism Underlay and Overlayin Al(Cu) Metalleorgy" VLSI Conf. (Jun. 11–12, 1991) pp. 242–248.

*Primary Examiner*—George Fourson
*Assistant Examiner*—C. Everhart
*Attorney, Agent, or Firm*—Fish & Richardson P.C.

[57] ABSTRACT

A method of forming a metal wire in a semiconductor device is disclosed. A multistage process, using the chemical vapor deposition method, with intermediate exposure to the atmosphere is to employed to deposit several layers of thin metal nitride film around and into a contact hole or via hole. Accordingly, the electrical connecting characteristic of a metal wire is enhanced.

2 Claims, 2 Drawing Sheets

METHOD OF FORMING A METAL WIRE IN A SEMICONDUCTOR DEVICE

FIELD OF THE INVENTION

This invention relates to a method of forming a metal wire in a semiconductor device, and more particularly, to a method of forming a metal wire in a semiconductor device which can form a metal wire by depositing and filling metal thin films in a contact hole or a via hole by the chemical vapor deposition method in order to form a metal wire using a multistage process.

INFORMATION DISCLOSURE STATEMENT

Generally, in order to form an electrode or contact between isolated areas in a semiconductor device, contact holes or via holes are formed on desired portion and metal is filled in these holes. A metal wire is then formed. It is desirable to use metal such as titanium nitride(TiN) for diffusion protection to fill these holes.

The sputtering method or the chemical vapor deposition method is used to fill these holes with titanium nitride. To make a very highly integrated semiconductor, the chemical vapor deposition method is mainly used because a thin metal film which is formed by the sputtering method deteriorates the step-coverage.

If the thin titanium nitride film which is formed by the chemical vapor deposition method became thick, the stress is increased and as a result, a crack may appear on the thin metal film. Therefore, it becomes difficult to fill the contact hole. Hence, electrical connecting characteristic of the metal wire which is formed by the forward process deteriorates.

Therefore, it is an objective of the present invention to solve the above mentioned problems.

Further, it is the objective of the present invention to provide a method of forming a metal wire in a semiconductor device by which a thin metal film is deposited and filled in a contact hole or a via hole by the chemical vapor deposition method in order to form a metal wire using a multistage process.

SUMMARY OF THE INVENTION

The present invention achieves the above mentioned objectives, and is comprised of the following processes:

providing a silicon substrate;

forming a contact hole by removing a portion of an oxide layer overlaying the silicon substrate, thereby exposing a junction area on the silicon substrate;

forming a thin titanium layer on the resulting silicon substrate including the contact hole by a chemical vapor deposition process;

forming a first thin titanium nitride layer on the thin titanium layer;

exposing the resulting silicon substrate including the first titanium nitride layer to the atmosphere;

forming a second thin titanium nitride layer on the first thin titanium nitride layer by the chemical vapor deposition process;

exposing the resulting silicon substrate including the second thin titanium nitride layer to the atmosphere;

forming a thin third titanium nitride layer on the second thin titanium nitride layer by the chemical vapor deposition process;

exposing the resulting silicon substrate including the third thin titanium nitride layer to the atmosphere;

removing the thin titanium layer, and the first, second and third thin titanium nitride layers overlaying the surface of the oxide layer so as to expose the oxide layer;

sequentially depositing a titanium-containing tungsten layer, an aluminum alloy layer and a fourth thin titanium nitride layer on the resulting silicon substrate; and removing a portion of the titanium-containing tungsten layer, the aluminum alloy layer and the fourth thin titanium nitride layer to form a metal wire.

BRIEF DESCRIPTION OF THE DRAWINGS

For a detailed understanding of the nature and objectives of the invention, reference should be made to the following detailed description taken in conjunction with the accompanying drawings in which.

Similar reference characters refer to similar parts throughout the several views of the drawings.

DETAILED DESCRIPTION OF THE INVENTION

FIG. 1A through 1E illustrate cross sectional views illustrating steps to form a metal wire in a semiconductor device according to the present invention.

Figure 1A:
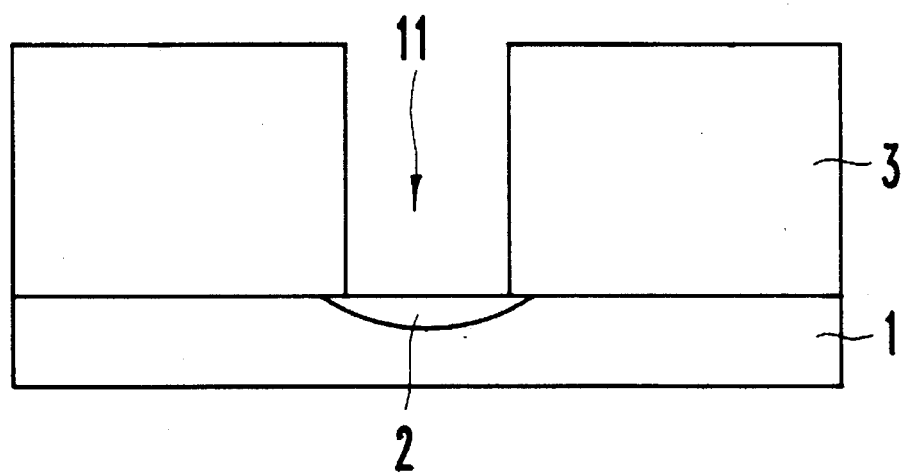
FIG. 1A through 1E illustrate cross sectional views illustrating steps forming a metal wire in a semiconductor device according to the present invention.

Referring to FIG. 1A, an oxide layer 3 is deposited on the silicon substrate 1 in which a junction area 2 is formed. A contact hole 11 is formed by removing a portion of the oxide layer 3 to expose the junction area 2 using a photo mask process and a wet etching process.

Figure 1B:
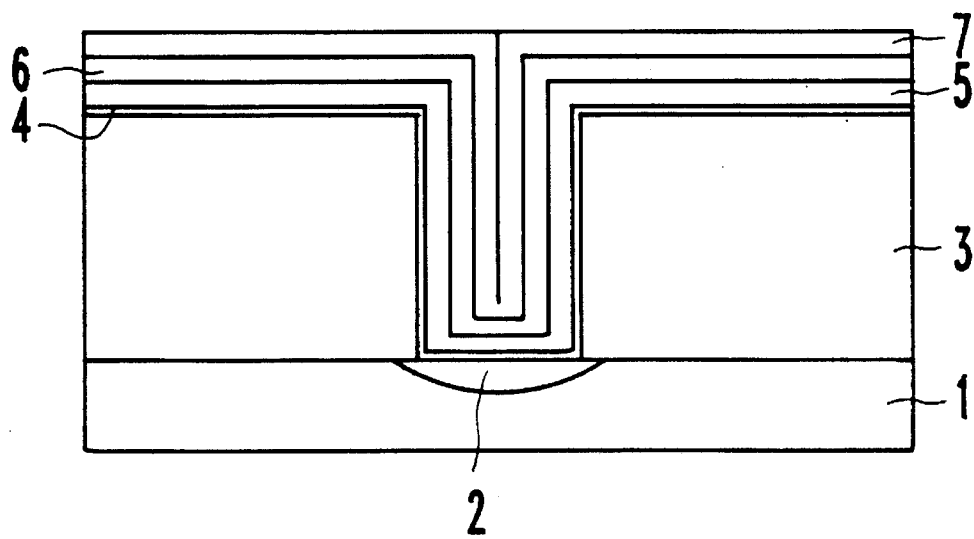

Referring to FIG. 1B, a first, second, third and fourth thin metal films 4, 5, 6 and 7 are deposited on the resulting silicon substrate. The first thin metal film 4 is preferably formed by titanium and is used to decrease the contact resistance at the junction area 2. A first thin titanium nitride layer 5, a second thin titanium nitride layer 6 and a third titanium nitride layer 7 are sequentially formed on the thin titanium layer 4 by a chemical vapor deposition process which should be conducted at least 2 times. Furthermore, each of the thin titanium nitride layers 5, 6 and 7 must be thin enough to not cause a crack on the thin titanium nitride layers 5, 6 and 7 i.e., the first thin titanium nitride layer 5 is formed in the deposition chamber which is not shown in the drawing and then the resulting silicon substrate on which the first thin titanium nitride layer 5 is deposited is exposed to the atmosphere out of the deposition chamber. The second thin titanium nitride layer 6 is then formed in the deposition chamber and the resulting silicon substrate on which the first and second thin titanium nitride layers 5 and 6 are formed is exposed to the atmosphere outside of the deposition chamber. The third thin nitride layer 7 is formed in the above mentioned method.

The reason that the thin titanium nitride layers must be exposed on the atmosphere is to protect against cracks thereof. If nitride is continuously deposited in the deposition chamber under a constant vacuum, cracks are likely to be generated on the titanium since it can be deposited thick in a single time. Also, in order to improve the characteristics of the thin titanium nitride layers, after each of the thin titanium nitride layers is deposited, the annealing process may be advanced.

Figure 1C:
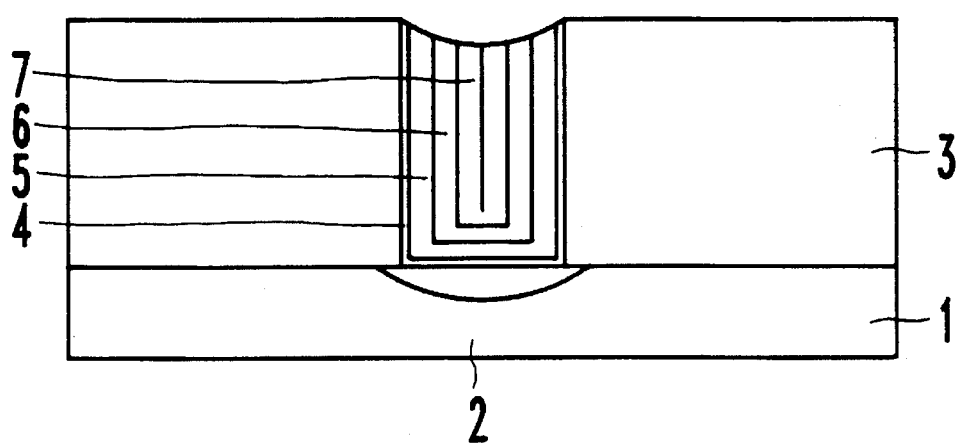

Referring to FIG. 1C, the thin titanium layer 4, the first, second and third thin titanium nitride layers 5, 6 and 7 on the oxide layer 3 and the contact hole are removed to expose the oxide layer 3.

Figure 1D:
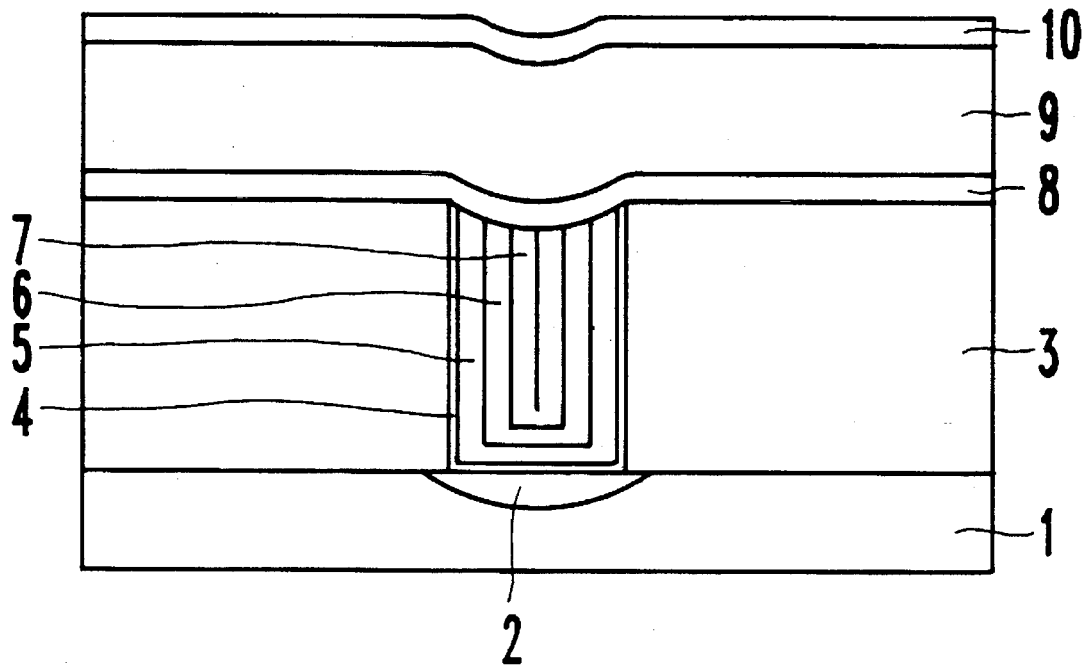

Referring to FIG. 1D, a titanium-containing tungsten layer 8, an aluminum alloy layer 9 and a fourth thin titanium nitride layer 10 are sequentially deposited on the resulting silicon substrate. A titanium nitride layer may be formed instead of the titanium-containing tungsten layer 8.

All the fourth thin titanium nitride layer 10 is used for decreasing the diffused reflection at the photo mask process to form with accuracy a metal wire.

Figure 1E:
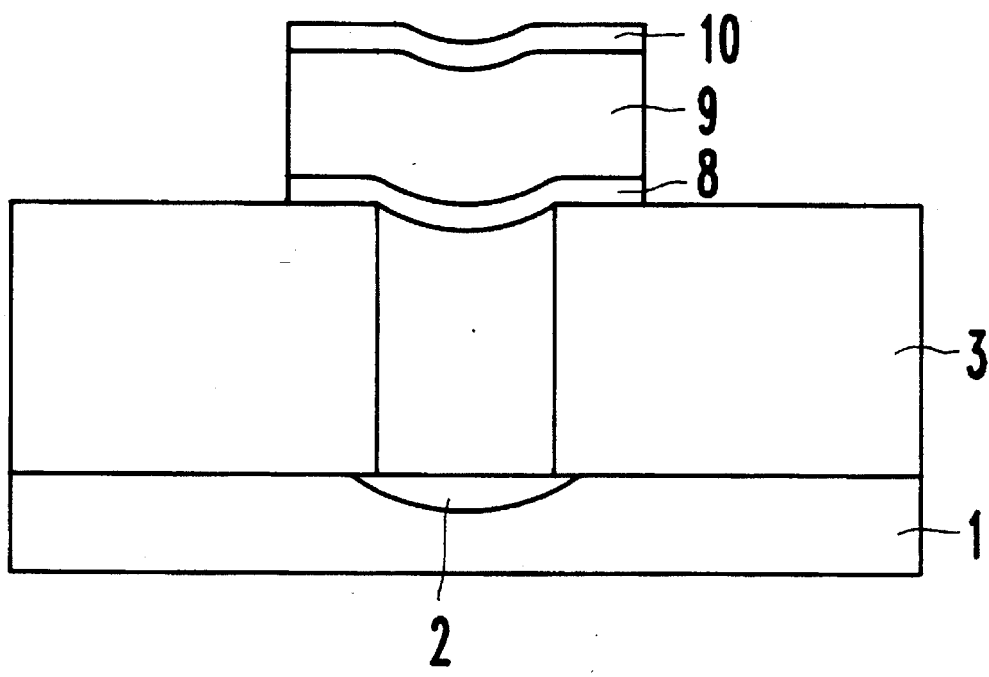

Referring to FIG. 1E, a portion of the layers 8, 9 and 10 are removed to form a metal wire by the photo mask process and the etching process.

The aluminum alloy layer 9 and the fourth thin titanium nitride layer 10 may be formed without the titanium-containing tungsten layer 8. The above process may also be advanced without the first thin metal film. The invention may also be applied to the via hole.

As described above, the electrical connection characteristic of a metal wire is improved since a thin metal film is deposited and filled on a contact hole or a via hole using the multistage process to form a metal wire according to the present invention.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of forming a metal wire in a semiconductor device comprising:

providing a silicon substrate which has an overlying oxide layer and a junction area;

forming a contact hole by removing a portion of the oxide layer overlaying said silicon substrate, thereby exposing the junction area on said silicon substrate but leaving at least one surface of said oxide layer;

forming a titanium layer on the resulting silicon substrate including said contact hole and said at least one surface, said layer formed by a chemical vapor deposition process;

forming a first titanium nitride layer on said titanium layer;

exposing the resulting silicon substrate including said first titanium nitride layer to the atmosphere;

forming a second titanium nitride layer on said first titanium nitride layer by a chemical vapor deposition process;

exposing the resulting silicon substrate including said second titanium nitride layer to the atmosphere;

forming a third titanium nitride layer on said second titanium nitride layer by a chemical vapor deposition process;

exposing the resulting silicon substrate including said third titanium nitride layer to the atmosphere;

removing said titanium layer and said first, second and third titanium nitride layers overlaying said at least one surface of said oxide layer so as to expose said one surface of said oxide layer and first surfaces of said first, second and third layers;

sequentially depositing a titanium-containing tungsten layer, an aluminum alloy layer and a fourth titanium nitride layer on the resulting one surface of said oxide layer and first surfaces of said first, second and third layers; and removing a portion of said titanium-containing tungsten layer, said aluminum alloy layer and said fourth titanium nitride layer to form a metal wire.

2. A method of forming a metal wire in a semiconductor device comprising:

providing a silicon substrate which has an overlying oxide layer and a junction area;

forming a contact hole by removing a portion of the oxide layer overlaying said silicon substrate, thereby exposing the junction area on said silicon substrate but leaving at least one surface of said oxide layer;

forming a titanium layer on the resulting silicon substrate including said contact hole and said at least one surface by a chemical vapor deposition process;

forming a first titanium nitride layer on said titanium layer;

annealing the resulting silicon substrate including said first titanium nitride layer;

forming a second titanium nitride layer on said first titanium nitride layer by a chemical vapor deposition process;

annealing the resulting silicon substrate including said second titanium nitride layer;

forming a third titanium nitride layer on said second titanium nitride layer by a chemical vapor deposition process;

annealing the resulting silicon substrate including said third titanium nitride layer;

removing said titanium layer, said first, second and third titanium nitride layers overlaying said at least one surface of said oxide layer so as to expose said one surface of said layer and first surfaces of said first, second and third layers;

sequentially depositing a titanium-containing tungsten layer, an aluminum alloy layer and a fourth titanium nitride layer on the resulting one surface of said oxide layer and first surfaces of said first, second and third layers; and removing a portion of said titanium-containing tungsten layer, said aluminum alloy layer and said fourth titanium nitride layer to form a metal wire.

* * * * *